US010662310B2

(12) United States Patent
Tchoul et al.

(10) Patent No.: US 10,662,310 B2
(45) Date of Patent: May 26, 2020

(54) OPTOELECTRONIC COMPONENT HAVING A CONVERSATION ELEMENT WITH A HIGH REFRACTIVE INDEX

(71) Applicant: OSRAM Opto Semiconductors GmbH, Regensburg (DE)

(72) Inventors: Maxim N. Tchoul, Winchester, MA (US); Thomas Dreeben, Swampscott, MA (US); Adam Scotch, Amesbury, MA (US); Alan Piquette, Kensington, MA (US); Gertrud Kräuter, Regensburg (DE); Darshan Kundaliya, Middleton, MA (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/960,739

(22) Filed: Apr. 24, 2018

(65) Prior Publication Data

US 2019/0322837 A1    Oct. 24, 2019

(51) Int. Cl.
| | | |
|---|---|---|
| *C08K 3/22* | (2006.01) | |
| *H01L 33/50* | (2010.01) | |
| *H01L 33/56* | (2010.01) | |
| *C09K 11/02* | (2006.01) | |
| *C09K 11/77* | (2006.01) | |

(52) U.S. Cl.
CPC ............ *C08K 3/22* (2013.01); *C09K 11/025* (2013.01); *C09K 11/7706* (2013.01); *H01L 33/502* (2013.01); *H01L 33/56* (2013.01); *C08K 2003/2244* (2013.01); *C08K 2201/001* (2013.01); *C08K 2201/003* (2013.01); *C08K 2201/011* (2013.01); *H01L 2933/0091* (2013.01)

(58) Field of Classification Search
CPC ....... H01L 33/50; H01L 51/52; H01L 33/502; H01L 33/56; C08K 3/22; C08K 2003/2244; C08K 2201/001; C08K 2201/003; C08K 2201/011; C09K 11/025; C09K 11/02; C09K 11/77
USPC .......................................................... 257/98
See application file for complete search history.

(56) References Cited

U.S. PATENT DOCUMENTS

| | | | | |
|---|---|---|---|---|
| 2011/0098420 | A1* | 4/2011 | Takizawa | ................ C08L 83/04 525/477 |
| 2012/0043552 | A1* | 2/2012 | David | ................ C09K 11/0883 257/76 |
| 2013/0345359 | A1 | 12/2013 | Onai et al. | |
| 2015/0162509 | A1* | 6/2015 | Kuramoto | ............... H01L 33/50 257/98 |

(Continued)

FOREIGN PATENT DOCUMENTS

EP    2 927 969    10/2015

OTHER PUBLICATIONS

Internatioanl Search Report and Written Opinion dated May 29, 2019, from counterpart Application No. PCT/EP2019/057404.

*Primary Examiner* — Alexander O Williams
(74) *Attorney, Agent, or Firm* — DLA Piper LLP (US)

(57) ABSTRACT

An optoelectronic component includes a semiconductor chip that is able to emit radiation having a wavelength of 400 nm to 490 nm, a conversion element including a reactive polysiloxane matrix material, a wavelength converting phosphor and filler nanoparticles, wherein the filler nanoparticles have a diameter of smaller than 15 nm and modify the refractive index and yield a mixture when added to the reactive polysiloxane matrix material.

16 Claims, 4 Drawing Sheets

(56) References Cited

U.S. PATENT DOCUMENTS

| | | | |
|---|---|---|---|
| 2015/0243859 A1* | 8/2015 | Schmidtke | H01L 33/56 257/98 |
| 2015/0274895 A1* | 10/2015 | Okawa | H01L 33/56 523/210 |
| 2015/0303358 A1* | 10/2015 | Ko | H01L 33/50 257/98 |
| 2015/0318454 A1* | 11/2015 | Ko | H01L 33/50 257/98 |
| 2017/0117444 A1* | 4/2017 | Stoll | H01L 51/5281 |
| 2017/0162765 A1 | 6/2017 | Kuramoto et al. | |
| 2017/0331016 A1* | 11/2017 | Tchoul | H01L 33/507 |
| 2018/0340119 A1* | 11/2018 | Piquette | F21V 7/22 |

* cited by examiner

|  | m | f | ff | V | RI |
|---|---|---|---|---|---|
| $ZrO_2$-50 | 50 | 50 | 60 | 43 | 1.55 |
| $ZrO_2$-70 | 30 | 70 | 78 | 64 | 1.63 |
| $ZrO_2$-80 | 20 | 80 | 86 | 76 | 1.68 |

|  | RI | P | d | $c_x$ | $c_y$ | L | I |
|---|---|---|---|---|---|---|---|
| M | 1.43 | 45 | 85 | 0.410 | 0.441 | 114 | R |
| M+$ZrO_2$ | 1.63 | 44 | 71 | 0.410 | 0.438 | 127 | +11% |

OPTOELECTRONIC COMPONENT HAVING A CONVERSATION ELEMENT WITH A HIGH REFRACTIVE INDEX

TECHNICAL FIELD

This disclosure relates to an optoelectronic component.

BACKGROUND

The most common method of producing optoelectronic components, e.g., white light-emitting diodes, is the use of a blue light-emitting diode (LED) with radiation in the range of 400 to 470 nm in combination with one or more luminescent phosphors. The phosphor absorbs at least partially a fraction of the blue light and emits light in the range of 500 to 700 nm in a process commonly referred to as down conversion.

The combination of the down-converted light and the blue radiation from the LED or semiconductor chip provides a full spectrum white light. It is known that the energy of the emitted white light is less than the electrical energy supplied to the LED due to a number of factors. There is thus a need to address two types of energy loss, in particular the loss of blue light on the interface between the chip and the encapsulating matrix and the loss of multi-wavelength light that is passing through the phosphor filled conversion material. The first loss occurs due to a total internal reflection on the interface between the LED and encapsulation matrix material which is proportional to the ratio of the refractive index of the LED material, (for example, 2.44 for indium gallium nitride) and that of the phosphor matrix material, which is from 1.4 to 1.55 for most of the currently used commercial polymeric matrix materials. The second loss occurs due to the loss of light scattered by the phosphor particles. That scattering is proportional to the ratio of the refractive index of the phosphor particles, for example, 1.8 for YAG-type phosphor) to that of the matrix material. It is easy to see that increasing the refractive index of the matrix material is expected to reduce both types of light losses and result in a higher efficiency of the phosphor-converting LED products.

It could therefore be helpful to provide an optoelectronic component having a conversion element, wherein in particular the conversion element has a high refractive index.

SUMMARY

We provide an optoelectronic component including a semiconductor chip that emits radiation having a wavelength range of 400 nm to 490 nm, and a conversion element including a reactive polysiloxane matrix material, a wavelength converting phosphor and filler nanoparticles, the filler nanoparticles have a diameter of smaller than 15 nm and modify the refractive index and yield a mixture when added to the reactive polysiloxane matrix material.

LIST OF REFERENCE NUMERALS

100 optoelectronic component
1 semiconductor chip
2 reactive polysiloxane matrix material
3 wavelength converting phosphor
4 conversion element
5 filler nanoparticles

DETAILED DESCRIPTION

Our optoelectronic component may comprise a semiconductor chip. The semiconductor chip is able to emit radiation, in particular in operation. In particular, the semiconductor chip is able to emit radiation having a wavelength of 400 nm to 490 nm, in particular of 420 nm to 470 nm, for example, 450 nm. The optoelectronic component has a conversion element. The conversion element comprises or consists of a reactive polysiloxane matrix material, a wavelength converting phosphor and filler nanoparticles. The filler particles have a diameter of smaller than 15 nm, modify the refractive index and yield a mixture when added to the reactive polysiloxane matrix material.

The mixture can be transparent, in particular if the reactive polysiloxane matrix material and filler nanoparticles, but not the wavelength converting phosphor, are present.

The optoelectronic component may comprise a semiconductor chip. The semiconductor chip is able to emit radiation, in particular in operation. In particular the semiconductor chip is able to emit radiation having a wavelength of 400 nm to 490 nm, in particular of 420 nm to 470 nm, for example, 450 nm. The optoelectronic component has a conversion element. The conversion element comprises or consists of a reactive polysiloxane matrix material, a wavelength converting phosphor and filler nanoparticles. The filler nanoparticles modify the refractive index. The filler nanoparticles comprise an inorganic core, or consist thereof, and an organic coating. The filler particles have a diameter of smaller than 15 nm.

The semiconductor chip may comprise a semiconductor layer or a semiconductor layer sequence. The semiconductor layers or the semiconductor layer sequence of the semiconductor chip are preferably based on a III-V compound semiconductor material. The semiconductor material is preferably a nitride compound semiconductor material such as $Al_nIn_{1-n-m}Ga_mN$ or else a phosphide compound semiconductor material such as $Al_nIn_{1-n-m}Ga_mP$, wherein in each case $0 \leq n \leq 1$, $0 \leq m \leq 1$ and $n+m \leq 1$. The semiconductor material can likewise be $Al_xGa_{1-x}As$, where $0 \leq x \leq 1$. In this case, the semiconductor layer sequence can have dopants and additional constituents. For the sake of simplicity, however, only the essential components of the crystal lattice of the semiconductor layer sequence, i.e., Al, As, Ga, In, N or P, are shown, even if they can be partially replaced and/or supplemented by small quantities of further substances.

The semiconductor layer sequence comprises an active layer having at least one pn junction and/or having one or more quantum well structures. During operation of the semiconductor chip, electromagnetic radiation is generated in the active layer. A wavelength of the radiation is preferably in the ultraviolet and/or visible spectral range, in particular 420 nm to 680 nm, for example, 440 nm to 480 nm.

The optoelectronic semiconductor chip may be a light-emitting diode, LED for short. The semiconductor chip or the optoelectronic component is then preferably designed for the purpose of emitting blue light or white light, in particular if the semiconductor chip has a converter element.

The optoelectronic component may comprise a conversion element. In particular the conversion element is arranged in the beam path of the semiconductor chip. The conversion element comprises or consists of reactive polysiloxane matrix material, a wavelength converting phosphor, in particular one or more wavelength converting phosphors, and filler nanoparticles.

The wavelength converting phosphor may be formed as particles, wherein the product of the thickness of the conversion element, the phosphor particles' number density and the phosphor particles' scattering cross-section is equal or greater than 10, 15, 20 or 30.

The content of the filler nanoparticles in the conversion element may be 50 wt % to 90 wt %, in particular 50 wt % to 85 wt %, in particular 60 wt % to 70 wt %, for example, 65 wt %.

Each of the filler nanoparticles may comprise an inorganic core selected from the group consisting of high refractive index compounds (n>1.7) that are transparent in the visible range of light, e.g., titanium dioxide, zirconium dioxide, barium titanate, strontium titanate, zinc oxide and aluminium oxide. In particular, the inorganic core is titanium dioxide or zirconium dioxide.

The difference of the refractive index of the conversion element and the polysiloxane matrix material may be at least 0.2, 0.3, 0.4, or 0.5.

The polysiloxane matrix material may be produced by a polysiloxane precursor material comprising the formula wherein A, B, A' and A" each represent side groups, O-A" represents a reactive group, 0<n≤1, 0≤m<1 and n+m=1.

The inorganic core and the organic coating of the filler nanoparticles may chemically connect to each other.

The diameter of the filler nanoparticles may be less than 10 nm, in particular to 1.5 nm to 5.5 nm, in particular 1.8 nm to 4.0 nm, for example, 3 nm. Diameter of the filler nanoparticles means the diameters of the inorganic core and the organic coating.

The polysiloxane matrix material may be produced by a polysiloxane precursor material that is reactive and comprises the formula:

wherein A, A', A" and B are selected independently of each other from the group consisting of methyl, ethyl, phenyl and trifluoropropyl, where 0≤x≤1, 0≤y≤1, 0≤n≤1 and 0≤m≤1. In particular is: 0.8≤x≤1, 0≤y≤0.2, 0.8≤n≤1 and 0≤m≤0.2.

The polysiloxane matrix material may be a LRI matrix. This means a low refractive index material having a refractive index of 1.39 to 1.45.

The polysiloxane matrix material may be a HRI matrix. HRI means that the polysiloxane matrix material is a high refractive index matrix material having a refractive index of 1.46 to 1.55.

The optoelectronic component may emit white radiation, in particular in operation.

The conversion element may be a plate. This means that the conversion element is not directly produced on the surface of the semiconductor chip. The conversion element is produced separately as a plate and then, in a so-called pick and place process, applied to the surface of the semiconductor chip, in particular on the main radiation surface of the semiconductor chip.

The conversion element may be a casting body.

The refractive index of the conversion element may be more than 1.6, 1.7 or 1.8.

The conversion element may be transparent for radiation emitted by the semiconductor chip.

The viscosity of the polysiloxane precursor material may be 1 to 80 mPas.

We recognized that a class of materials comprising a reactive polysiloxane matrix material containing inorganic particles leads to advantages in producing a matrix material for encapsulation of luminescent phosphors in light-emitting diodes. The reactive polysiloxane matrix material is distinguished from known materials by possessing a high refractive index, in particular 1.55 to 1.7, intended to increase light output out of the light-emitting diodes compared to current commercial encapsulation matrix materials having refractive indices of 1.4 to 1.55.

Polysiloxanes are very often used as phosphor encapsulation matrix materials in high power phosphor conversion type LED packages. The refractive index of polysiloxanes ranges from 1.4 to 1.55. We recognized that the addition of filler nanoparticles, in particular organically modified inorganic filler nanoparticles with a high refractive index, is proposed as a solution to increase the refractive index of the reactive polysiloxane matrix material. The resulting refractive index of the particle-filled reactive polysiloxane matrix material can be estimated by the Maxwell Garnett effective medium model.

The conversion element may comprise a reactive polysiloxane matrix material.

Commonly polysiloxanes are the polymers having the general formula depicted in Scheme (1):

(1)

A and B are the functional groups including, but not limited to methyl (CH3), ethyl (C2H5), phenyl (C6H5), trifluoropropyl (C2H5CF3). Groups A and B attached to the same silicon atom may be identical to or different from each other.

The index "a" represents a number of monomeric groups in the polymer chain and typically varies from 100 to 1,000,000.

In contrast to the common polysiloxane material, we discovered a reactive polysiloxane matrix material. The reactive polysiloxane matrix material is depicted in Scheme (2):

(2)

Reactive polysiloxane matrix materials have two kinds of monomeric groups, one being identical to the above-described polysiloxanes and the other one including reactive group O-A″ where O is an atom of oxygen and A″ is a group similar to the group A described above. The group B is identical to the group B described above and A′ is a group similar to the A and B above. Groups A and B are similar to the A and B above. It is possible that A, A′, A″ and B are all the same functional group or different functional groups or some of the same and some different functional groups. The indices "n" and "m" represent the relative number fractions of the corresponding monomer groups in the reactive polysiloxane, each having the value of 0 to 1 where the sum of n+m is always 1.

Reactive polysiloxanes undergo a chemical reaction known as crosslinking or curing in which the group O-A″ reacts with water resulting in an exchange of this group to hydroxyl group OH attached to the silicone atom and releasing a molecule of alcohol with the general formula of A″OH. In the next step, two hydroxyl groups in the different polysiloxane chains condense resulting in the release of a molecule of water and linking of the two polysiloxane chains together through the oxygen atom (see Scheme (3)):

(3)

In Scheme (3) indices x and y each have or can have the values of 0 to 1, but the sum of x+y is always 1.

The wavelength converting layers of LEDs comprise crosslinked reactive polysiloxane matrix material containing luminescent phosphor particles.

The reactive polysiloxane matrix material may be produced by a polysiloxane precursor material. The polysiloxane precursor material has a molecular weight of less than 5000 g/mol, preferably less than 1500 g/mol, preferably less than 1400 g/mol, 1300 g/mol, 1200 g/mol, 1100 g/mol, 1000 g/mol or 900 g/mol.

The polysiloxane precursor material is in particular a liquid. In particular, the polysiloxane precursor material is liquid at room temperature.

An ideal example structure of such a precursor material is shown as follows:

The number of repeat units n can vary and should be chosen so that the viscosity of the precursor is 1 to 80 mPas. The number of repeat units n can be: n=2–20.

When exposed to water and, typically, a catalyst, the polysiloxane precursor material undergoes hydrolysis and condensation reactions which crosslink the low molecular weight polysiloxane units into a dense polysiloxane network. In particular the cured polysiloxane matrix material made from the polysiloxane precursor material comprises a three-dimensional crosslinking network primarily based on T-units. Additionally, D-units can be present to increase the flexibility of the cured material. The ratio of T-units to all units, e.g., D-units, can be greater than 80%. The content of D-units to all units can be at most 20%.

In general, polysiloxanes have different structural units, for example, Q, T, D or M units. Each has different functions. M units terminate change or three-dimensional entities. A higher proportion of M units therefore results in a lower molecular mass of the silicone. The combination of D-units results in chains, while each of the Q-unit and T-unit is a branching point. T-units are known to those skilled in the art. A T-unit can mean that one silicone atom has three bonds to three oxygen atoms. A D-unit can mean that one silicone atom has two bonds to two oxygen atoms.

In reality, not all of the methoxy groups necessarily result in crosslinking. Some can remain intact and some can be replaced by the silanol groups.

The following formula shows an example structure of a highly crosslinked cured reactive polysiloxane matrix material that can result from the hydrolysis and condensation of the polysiloxane precursor material. The structure is a schematic example that is easy to visualize, but is not meant to be technically accurate.

Fumed silica may be added to the polysiloxane precursor material. The fumed silica increases the viscosity, reduces shrinkage during curing and makes a slurry for a down-conversion layer. Once the fumed silica is roughly incorporated, the desired phosphor powder or blend of the phosphor powders are dispersed in the liquid polysiloxane precursor material as well.

The cured reactive polysiloxane matrix material may be a highly crosslinked network primarily made of siloxane bonds. The siloxane network is formed from a liquid or solution-based siloxane precursor. The generic formula for the reactive polysiloxane precursor is shown below:

wherein A, A', A" and B each represent side groups, $0.8 \leq n \leq 1$, $0 \leq m < 0.2$ and $n+m=1$.

The R- and T-groups can all be the same, for example, a methyl group. However, each functional group can be a different group. Some of the groups can be the same and some can be different. One of the groups can be made up of more than one functional group. For example, a precursor material can have m=0, $R^1$=methyl, and $R^2$ is a combination of methyl and phenyl.

The polysiloxane precursor material can be a methyl methoxy polysiloxane where the methoxy content is 10 wt % to 50 wt %, but is preferably closer to 15 wt % to 45 wt %, even more preferably to 25 wt % to 40 wt %. The structure can be like what is shown above, but it can also be another combination of a polysiloxane backbone with methyl and methoxy side groups.

For example, there can be silicone atoms with two methyl groups or two methoxy groups as long as the total methoxy content falls within the ranges above. The number of siloxane monomer units in the polysiloxane precursor material can be such that the viscosity is 1 to 150 mPas, but preferably 1 to 60 mPas, and even more preferably 2 to 40 mPas. The polysiloxane precursor material, also called precursor, can also be partially reacted like the following example, but non-limiting, formula:

In a partially reacted precursor, the methoxy content can be lower than in the pristine, unreacted precursor and viscosity can tend to be higher.

The terminal groups of the polysiloxane precursor material can contain one or more chemical reactive group such as alkoxy, vinyl, hydroxyl, carboxylic acid, ester, or any other of the reactive functional groups know from the organic chemistry field.

The terminal groups can be less reactive such as hydrogen, methyl, ethyl or any alkyl or aryl groups.

Methyl and methoxy side groups are preferred. This does not exclude other functional groups such as ethyl, ethoxy, phenyl, phenoxy, vinyl and/or trifluoropropyl.

It is possible that m=0, $R^2$ is either a methyl, a phenyl or a combination of the two, and $R^1$=ethyl with an ethoxy content of 10 to 50 wt %, but more preferably 20 to 30 wt %, and/or a viscosity in the range of 30 to 70 mPas. A small amount of solvent can be present.

It is possible that m=0, $R^2$ is a combination of methyl and phenyl, and $R^1$ is a methyl group. The methoxy content is 10 to 20 wt % along with a viscosity of 100 to 50 mPas.

The precursor or the polysiloxane precursor material can instead be based on a polysilazane precursor having a chemical backbone of alternating silicone and nitrogen atoms. The side groups can be hydrogen or any of those listed above. In the presence of water, the polysilizane can react to form a dense polysiloxane network similar to that formed from the siloxane-based precursors.

The conversion element may comprise at least one or exactly one wavelength converting phosphor or a number of wavelength converting phosphors.

The at least one phosphor can be selected from the group consisting of:
$(RE_{1-x}Ce_x)_3(Al_{1-y}A'_y)_5O_{12}$ with $0 < x \leq 0.1$ and $0 \leq y \leq 1$,
$(RE_{1-x}Ce_x)_3(Al_{5-2y}Mg_ySi_y)O_{12}$ with $0 < x \leq 0.1$ and $0 \leq y \leq 2$,
$(RE_{1-x}Ce_x)_3Al_{5-y}Si_yO_{12-y}N_y$ with $0 < x \leq 0.1$ and $0 \leq y \leq 0.5$,
$(RE_{1-x}Ce_x)_2CaMg_2Si_3O_{12}:Ce^{3+}$ with $0 < x \leq 0.1$,
$(AE_{1-x}Eu_x)_2Si_5N_8$ with $0 < x \leq 0.1$,
$(AE_{1-x}Eu_x)AlSiN_3$ with $0 < x \leq 0.1$,
$(AE_{1-x}Eu_x)_2Al_2Si_2N_6$ with $0 < x \leq 0.1$,
$(Sr_{1-x}Eu_x)LiAl_3N_4$ with $0 < x \leq 0.1$,
$(AE_{1-x}Eu_x)_3Ga_3N_5$ with $0 < x \leq 0.1$,
$(AE_{1-x}Eu_x)Si_2O_2N_2$ with $0 < x \leq 0.1$,
$(AE_xEu_y)Si_{12-2x-3y}Al_{2x+3y}O_yN_{16-y}$, with $0.2 \leq x \leq 2.2$ and $0 < y \leq 0.1$,
$(AE_{1-x}Eu_x)_2SiO_4$ with $0 < x \leq 0.1$,
$(AE_{1-x}Eu_x)_3Si_2O_5$ with $0 < x \leq 0.1$,
$K_2(Si_{1-x-y}Ti_yMn_x)F_6$ with $0 < x \leq 0.2$ and $0 < y \leq 1-x$,
$(AE_{1-x}EU_x)_5(PO_4)_3Cl$ with $0 < x \leq 0.2$,
$(AE_{1-x}Eu_x)Al_{10}O_{17}$ with $0 < x \leq 0.2$ and combinations thereof, wherein RE is one or more of Y, Lu, Tb and Gd; AE is one or more of Mg, Ca, Sr, Ba; A' is one or more of Sc and Ga; wherein the phosphors optionally include one or more of halides.

In operation, the phosphors are able to convert the radiation emitted by the semiconductor chip and convert this radiation into radiation having another wavelength.

The conversion element may comprise filler nanoparticles. The filler nanoparticles can modify the refractive index. The filler nanoparticles comprise or consist of an inorganic core and an organic coating. The filler nanoparticles can be added to the conversion element embodied as a plate or a casting body to change properties such as refractive index or thermal conductivity.

Alternatively, the filler nanoparticles and the phosphor have a concentration gradient in the reactive polysiloxane matrix material.

The optoelectronic component may be an organic or inorganic light-emitting device. In particular, the optoelectronic component is an inorganic light-emitting device, LED. The LED can be of the chip-on-board type or of the package LED type. The conversion element can be deposited directly on the semiconductor chip, it can be glued in close proximity to the semiconductor chip or it can be in a remote configuration.

The optoelectronic component can also be a laser diode.

The filler nanoparticles may comprise an organic coating. The organic coating encapsulates in particular the inorganic core. Thus, the filler nanoparticles are easy to handle, or are easily processable.

The content of the filler nanoparticles in the conversion element may be 1% to 90% by weight, preferably 50% to 80% by weight.

The content of the reactive polysiloxane matrix material may be 5% to 90% by weight, preferably 10% to 60% by weight.

The content of the wavelength converting phosphors in the conversion element may be 1% to 90% by weight, preferably 20% to 80% by weight.

Further advantages and developments will become apparent from examples described below in conjunction with the figures.

In the examples in the figures, identical or identically acting elements can each be provided with the same reference symbols. The elements illustrated and their size relationships to one another are not to be regarded as true to scale. Rather, individual elements such as, for example, layers, components, devices and regions can be represented with an exaggerated size for better representability and for a better understanding.

Figure 1:
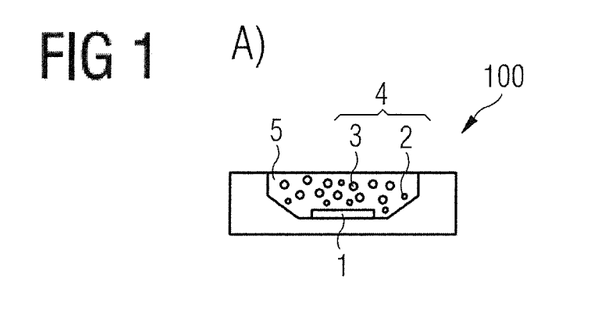
FIG. 1A shows a schematic illustration of an optoelectronic component according to an example.
FIG. 1B shows a schematic illustration of an optoelectronic component according to an example.

FIG. 1A shows the schematic side view of an optoelectronic component according to one example.

The optoelectronic component 100 comprises a semiconductor chip 1. The semiconductor chip 1 is able to emit radiation having a wavelength of 400 nm to 490 nm. In the beam path of the semiconductor chip 1, a conversion element 4 is arranged. The conversion element 4 comprises a reactive polysiloxane matrix material 2, a wavelength converting phosphor 3 and filler nanoparticles 5. The phosphor 3 and the filler nanoparticles 5 are dispersed in the reactive polysiloxane matrix material 2. The conversion element 4 is a casting body. The filler nanoparticles 5 modify the refractive index, in particular to increase the refractive index of the reactive polysiloxane matrix material and/or the wavelength converting phosphors 3. The filler nanoparticles 5 comprise an inorganic core and an organic coating, not shown. The organic coating encapsulates the inorganic core. The filler nanoparticles 5 have a diameter of smaller than 15 nm.

FIG. 1B shows the schematic side view of an optoelectronic component 100 according to one example.

The semiconductor chip 1 is arranged on a substrate. The substrate can be, for example, a sapphire wafer. A conversion element 4 is arranged on the main surface of the semiconductor chip 1. The conversion element 4 comprises a phosphor 3, reactive polysiloxane matrix material 2 and filler nanoparticles 5. The filler nanoparticles 5 and the wavelength converting phosphor 3 are dispersed homogenously in the polysiloxane matrix material 2. The conversion element 4 is a plate and is in particular placed on the main surface of the semiconductor chip 1 by a so-called pick-and-place process.

Both geometries of the optoelectronic components of FIGS. 1A and 1B utilize in particular a blue LED 1 covered with a conversion element 4 comprising a polymeric matrix 2 containing particles of luminescent phosphor 3 and filler nanoparticles 5.

Figure 2:
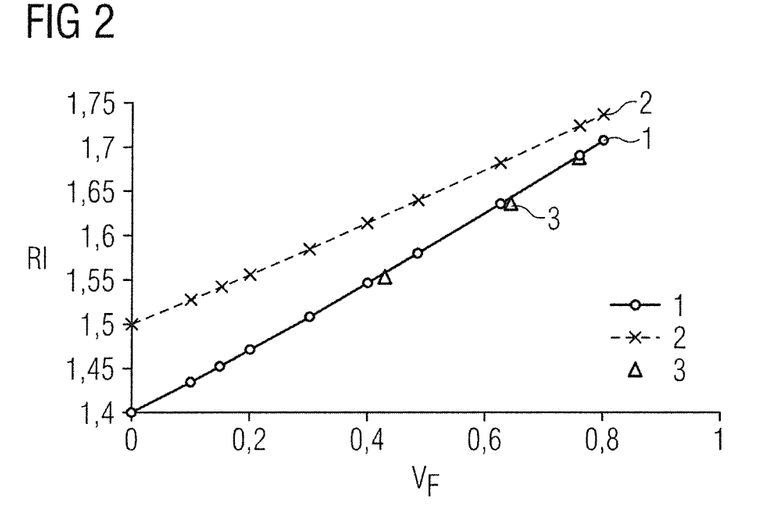
FIG. 2 shows the refractive index as a function of the filler volume fraction according to an experiment and LRI and HRI matrix.

FIG. 2 shows the refractive index RI of the composite as a function of the filler volume fraction $V_F$ of an LRI matrix 1, an HRI matrix 2 and the experiment 3. FIG. 2 shows the result of the calculations of the refractive index of two different types of polymeric matrix with a refractive index of 1.4 (LRI matrix) and 1.5 (HRI matrix) filled with hypothetical filler nanoparticles having a refractive index of 1.8.

The calculations suggest that a significant increase in refractive index can be achieved by adding filler nanoparticles to the reactive polysiloxane matrix material.

FIG. 2 shows the Maxwell Garnett model prediction of the refractive index of the nanoparticles filled polymeric matrix with two different intrinsic refractive indices and the data from Experiment 1 below.

Figure 3:
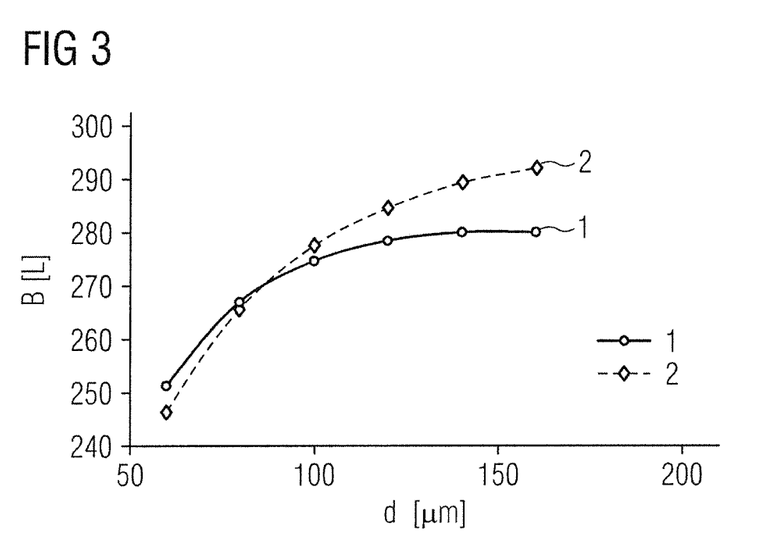
FIG. 3 shows the brightness as a function of the conversion layer thickness.

FIG. 3 shows the brightness B in lumen as a function of the conversion layer thickness d in μm of an LRI matrix with a refractive index of 1.43 (1) and a HRI matrix with a refractive index of 1.63 (2).

FIG. 3 shows the results of theoretical calculations predicting the luminescent output in the chip level conversion package having a wavelength converting layer comprised of a luminescent YAG phosphor dispersed in a polysiloxane matrix material. In this example, the phosphor concentration is 20% by volume. The refractive matrix (LRI matrix) is a pristine polysiloxane with a refractive index of 1.43 and the HRI matrix is the same polysiloxane filled with inorganic nanoparticles to increase the refractive index to 1.63. The blue semiconductor chip is in the simulation emitted light with the wavelength distribution centred at 448 nm and the optical power of 1.0 W. The calculations show that an extra luminous output of up to 4% can be achieved by using the HRI matrix compared to an LRI pristine matrix for a sufficiently thick wavelength conversion element.

FIG. 3 shows that not all configurations benefit from the HRI matrix. It also suggests that the benefit is present only if the matrix thickness exceeds 100 μm, but that is not a generally applicable criterion because it only applies to the volume phosphor concentration of 20%.

Figure 4:
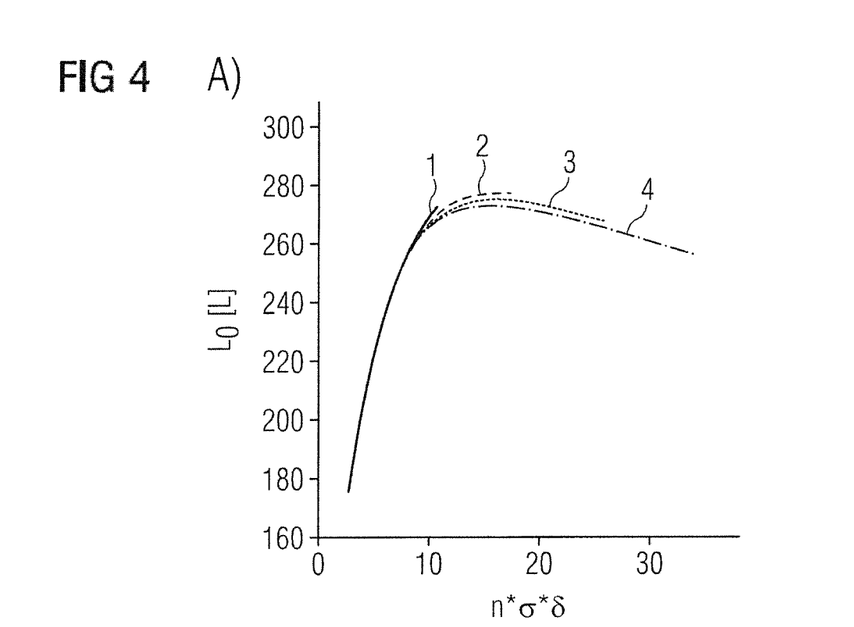
FIG. 4A shows the light output.
FIG. 4B shows the light output.

A more general criterion is established by casting a relevant dimensionless parameter in terms of measurable matrix quantities. This parameter is $$\theta = \sigma * n * \delta$$

where σ is the phosphor particle scattering cross-section, n is the phosphor particle number density and δ is the matrix thickness. In comparison to the brightness plotted against this parameter θ is shown for both low and high refractive indices in FIG. 4.

FIGS. 4A and 4B each shows the light output $L_0$ in lumen as a function of this parameter σ*n*δ. FIGS. 4A and 4B show the addition of 11.5% of phosphor (1), 20% phosphor (2), 30% phosphor (3) and 40% phosphor (4).

The theoretical calculations of luminescence output on the chip level conversion package over a range of phosphor concentration using pristine LRI matrix (FIG. 4A) and HRI matrix (FIG. 4B) is shown.

The parameter θ of the above-mentioned formula is shown on the horizontal guidance on conditions in which the HRI matrix offers an advantage. The comparison in FIGS. 4A and 4B show that the HRI matrix enables higher light output when the parameter θ exceeds a value of 10 and that this criterion can be used regardless of the particular concentration or matrix material.

Figure 5:
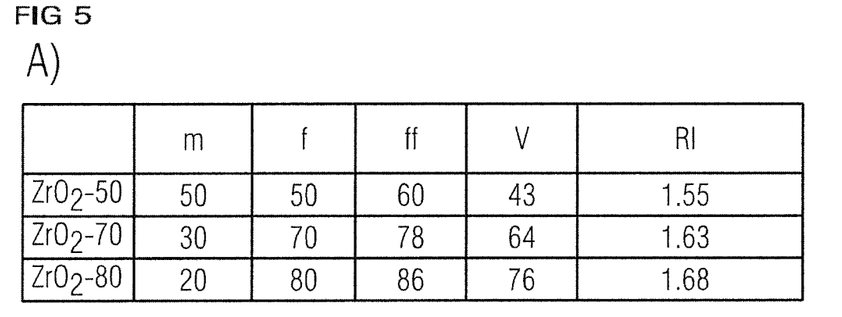
FIGS. 5A and 5B show examples for the conversion element.

FIG. 5A shows the experimental data of Experiment 1 and FIG. 5B the experimental data of Experiment 2.

FIG. 5A shows:
m—reactive polysiloxane matrix material in mass %
f—content of ZrO2 filler nanoparticles in mass %
ff—final ZrO2 filler nanoparticles fraction in cross-linked polysiloxane matrix material in mass %
V—ZrO2 Volume %
RI—refractive indices at 450 nm (measured by ellipsometry).

FIG. 5B shows:
RI—refractive indices at 450 nm (measured by ellipsometry)
P—content of phosphor in mass % d—layer thickness in μm
cx, cy—chromaticity
L—Light efficiency in Lumen/W (blue)
I—Increase in %
R—Reference
M—reactive polysiloxane matrix material
M+ZrO2—reactive polysiloxane matrix material and ZrO2 filler nanoparticles.

Experiment 1

In this experiment a reactive polysiloxane matrix material, in particular a reactive dimethyl siloxane, is used where groups A, A', A'' and B are all methyl groups (see Scheme 2) and the index n=1 and the index m=0.

To modify the refractive index filler nanoparticles, in particular zirconium dioxide nanoparticles, are used having the size of 3 to 5 nm.

The reactive polysiloxane matrix material and organically modified filler nanoparticles, for example, zirconium dioxide, are mixed in different ratios resulting in the materials $ZrO_2$-50, $ZrO_2$-70, and $ZrO_2$-80 as indicated in FIG. 5A. After crosslinking the reactive silicone, the polymer mass is reduced by about 30% resulting in the materials having 60, 78 and 86 mass per percent of zirconium nanoparticles or 43, 64 and 76 vol % correspondingly.

The solid film on glass slides are prepared and the refractive index is measured by ellipsometry. The results are presented in FIG. 5A. We found that the refractive index of the polysiloxane matrix material can be increased from 1.43 (pristine crosslinked polysiloxane) to as high as 1.68 by addition of zirconium dioxide filler nanoparticles.

Experiment 2

The wavelength converting layers of the two types as shown in FIGS. 1A and 1B are prepared by mixing the reactive polysiloxane matrix material described in experiment 1 with a phosphor, in particular YAG-type luminescent phosphor, followed by allowing the material to cure, resulting in the solid film. The film is then cut into 1×1 mm pieces and each piece attached to the blue LED dies creating chip level conversion as LED packages as is depicted in FIG. 1B. For the polysiloxane matrix material the wavelength converting layer contains 45% of the phosphor, 41% of the crosslinked reactive polysiloxane matrix material and 14% of fumed silica. The layer has a thickness of 85 μm.

For the high refractive index the polysiloxane matrix material and the filler nanoparticles, the conversion element contains 45% of the phosphor, 13% of the crosslinked polysiloxane matrix material and 43% of the filler nanoparticles, in particular organically modified zirconium dioxide nanoparticles. The layer has a thickness of 71 μm.

The refractive index of the referenced polysiloxane matrix material is 1.43 and the refractive index of the nanoparticles filled polysiloxane matrix is 1.63. For each type of conversion layer, 10 LED packages are assembled.

FIG. 5B presents the results of the photometry of the finished LED packages, the average values for each group are presented. To accurately compare the luminescence output of the two groups of LED packages, it is ensured that the chromaticity of the packages is approximately the same. Chromaticity as well as the luminous output is dependent on the emission spectrum of the light source. For this purpose the nanoparticle filled wavelength conversion elements, in particular conversion element embodied as a layer, of the lower thickness are selected to bring the chromaticity of the two groups of packages on the same level. This experiment shows that the LED packages comprising the nanoparticle filled polysiloxane matrix material exhibit an average brightness of 127 lumens whereas the LED packages utilizing the reference polysiloxane M as a matrix produce on average only 114 lumens. Thus by utilizing higher refractive index nanoparticles filled polymeric matrix material, an 11% increase in light output is achieved.

The optoelectronic component can comprise the following materials:

Reactive polysiloxane, catalyst (1-3% by weight based on polysiloxane, e.g., Titanium(IV) butoxide), 20-80 wt % nano-ZrO2 (dispersed in xylene or butyl acetate; 45% inorganic content). The mixture can be sprayed, dropcasted or tapecasted. After curing at room temperature the resulting solid is transparent and rigid.

Figure 6:
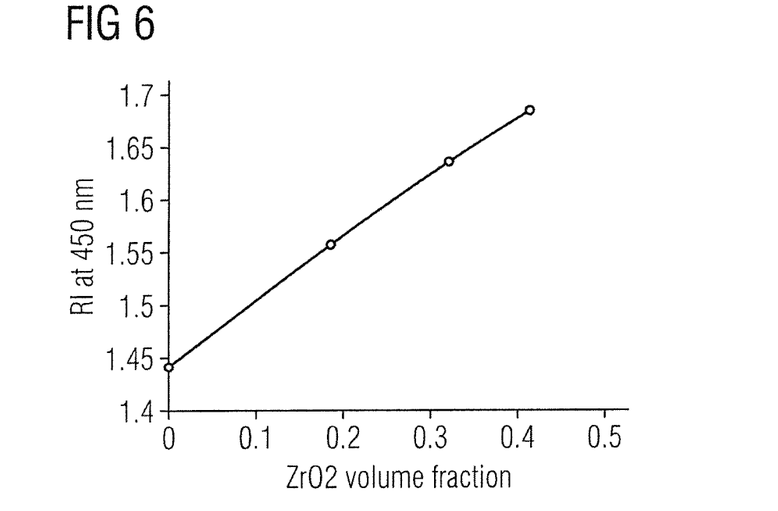
FIG. 6 shows examples for the conversion element.

FIG. 6 shows the refractive index at 450 nm as a function of the ZrO2 volume fraction.

The examples described in conjunction with the figures and the features thereof can also be combined with one another in accordance with further examples, even if such combinations are not explicitly shown in the figures. Furthermore, the examples described in conjunction with the figures can have additional or alternative features according to the description in the general part.

Our components are not restricted to the examples by the description on the basis of the examples. Rather, this disclosure comprises any new feature and any novel combination of features that includes in particular any combination of features in the appended claims, even if the feature or combination itself is not explicitly specified in the claims or examples.

The invention claimed is:

1. An optoelectronic component comprising:
a semiconductor chip that emits radiation having a wavelength range of 400 nm to 490 nm, and
a conversion element comprising a polysiloxane matrix material, a wavelength converting phosphor and filler nanoparticles,
wherein the polysiloxane matrix material is produced by a polysiloxane precursor material comprising formula (1):

wherein A, B, A' and A'' each represent side groups, O-A'' represents a reactive group, $0<n\leq 1$, $0\leq m<1$ and $n+m=1$, and
the filler nanoparticles have a diameter of smaller than 15 nm and modify the refractive index and yield a mixture when added to the polysiloxane matrix material.

2. The optoelectronic component according to claim 1, wherein the wavelength converting phosphor is formed as particles, and the product of the thickness of the conversion element, the phosphor particles' number density and the phosphor particles' scattering cross-section is equal or greater than 10.

3. The optoelectronic component according to claim 1, wherein the content of the filler nanoparticles in the conversion element is 50 to 90 wt %.

4. The optoelectronic component according to claim 1, wherein each of the filler nanoparticles comprises an inorganic core selected from the group consisting of high refractive index compounds (n>1.7) that are transparent in the visible range of light.

5. The optoelectronic component according to claim 1, wherein the difference of the refractive index of the conversion element and the polysiloxane matrix material is at least 0.2.

6. The optoelectronic component according to claim 1, wherein the diameter of the filler nanoparticles is less than 10 nm.

7. The optoelectronic component according to claim 1, wherein the polysiloxane matrix material is a low refractive index matrix.

8. The optoelectronic component according to claim 1, wherein the polysiloxane matrix material is a high refractive index matrix.

9. The optoelectronic component according to claim 1, wherein the optoelectronic component emits white radiation.

10. The optoelectronic component according to claim 1, wherein the conversion element is a plate.

11. The optoelectronic component according to claim 1, wherein the conversion element is a casting body.

12. The optoelectronic component according to claim 1, wherein the refractive index of the conversion element is more than 1.6.

13. The optoelectronic component according to claim 1, wherein the conversion element partially converts the radiation emitted by the semiconductor chip.

14. The optoelectronic component according to claim 1, wherein the viscosity of the polysiloxane precursor material is 1 to 80 mPas.

15. An optoelectronic component comprising:
a semiconductor chip that emits radiation having a wavelength range of 400 nm to 490 nm, and
a conversion element comprising a polysiloxane matrix material, a wavelength converting phosphor and filler nanoparticles,
wherein the polysiloxane matrix material is produced by a polysiloxane precursor material, which is reactive and comprises formula (1):

wherein A, A', A" and B are selected independently of each other from the group consisting of methyl, ethyl, phenyl and trifluoropropyl, where $0 \leq n \leq 1$ and $0 \leq m \leq 1$, and
the filler nanoparticles have a diameter of smaller than 15 nm and modify the refractive index and yield a mixture when added to the polysiloxane matrix material.

16. The optoelectronic component according to claim 15, wherein the wavelength converting phosphor is formed as particles, and the product of the thickness of the conversion element, the phosphor particles' number density and the phosphor particles' scattering cross-section is equal or greater than 10.

* * * * *